(12) United States Patent
Kubota

(10) Patent No.: US 10,749,510 B2
(45) Date of Patent: Aug. 18, 2020

(54) SEMICONDUCTOR DEVICE AND CONTROL METHODS THEREOF

(71) Applicant: RENESAS ELECTRONICS CORPORATION, Tokyo (JP)

(72) Inventor: Yasunori Kubota, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/545,536

(22) Filed: Aug. 20, 2019

(65) Prior Publication Data
US 2020/0091898 A1    Mar. 19, 2020

(30) Foreign Application Priority Data

Sep. 14, 2018  (JP) ................................. 2018-172617

(51) Int. Cl.
| | | |
|---|---|---|
| H03K 3/03 | (2006.01) | |
| H03K 21/02 | (2006.01) | |
| G06F 1/04 | (2006.01) | |
| H03K 5/26 | (2006.01) | |
| H03K 21/38 | (2006.01) | |

(52) U.S. Cl.
CPC ................. *H03K 3/03* (2013.01); *G06F 1/04* (2013.01); *H03K 5/26* (2013.01); *H03K 21/026* (2013.01); *H03K 21/38* (2013.01)

(58) Field of Classification Search
USPC ................................... 327/147–149, 156–158
See application file for complete search history.

(56) References Cited

U.S. PATENT DOCUMENTS

| | | | | |
|---|---|---|---|---|
| 5,180,991 A | * | 1/1993 | Takashima | ............... H03B 5/20 331/1 A |
| 5,821,781 A | * | 10/1998 | Rigazio | .................... H03K 3/03 327/99 |
| 6,329,860 B1 | * | 12/2001 | Komatsu | ............. H03K 3/0231 327/105 |
| 7,420,426 B2 | * | 9/2008 | Herrin | .................... H03C 3/095 327/156 |
| 7,529,961 B2 | | 5/2009 | Kondou | |
| 9,258,001 B1 | * | 2/2016 | Das | ......................... H03L 7/148 |

(Continued)

FOREIGN PATENT DOCUMENTS

| | | |
|---|---|---|
| JP | 07-15320 A | 1/1995 |
| JP | 2006-172202 A | 6/2006 |

*Primary Examiner* — Adam D Houston
(74) *Attorney, Agent, or Firm* — McDermott Will & Emery LLP

(57) ABSTRACT

A semiconductor device includes a first oscillator circuit, a clock monitoring circuit and a timing signal generation circuit for periodically switching the operating mode of the clock monitoring circuit to one of the first to third modes. The clock monitoring circuit includes: a clock counter configured for counting the number of oscillations of the clock signal in the first mode and configured for shifting the pulses of the input signal to the output signal at normal time in the third mode; a comparison circuit for comparing whether the count value per predetermined period by the clock counter is within an expected value in the second mode; and an edge detection circuit for detecting whether the pulses of the input signal are shifted to the output signal of the clock counter in the third mode.

14 Claims, 11 Drawing Sheets

(56) References Cited

U.S. PATENT DOCUMENTS

| | | | |
|---|---|---|---|
| 2003/0184353 A1* | 10/2003 | Chu | H03F 3/3067 327/157 |
| 2007/0168631 A1* | 7/2007 | Heo | G11C 7/1051 711/163 |
| 2008/0012549 A1* | 1/2008 | Kam | G01R 29/26 324/76.54 |
| 2009/0033477 A1* | 2/2009 | Illium | B60R 21/0134 340/436 |
| 2010/0253400 A1* | 10/2010 | Lai | H03L 7/0991 327/156 |
| 2010/0315131 A1* | 12/2010 | Lin | H03K 23/425 327/117 |
| 2011/0156774 A1* | 6/2011 | Ge | H03L 1/027 327/156 |
| 2011/0234137 A1* | 9/2011 | Imamura | G06F 1/04 318/453 |
| 2011/0291720 A1* | 12/2011 | Ku | H03L 7/0814 327/158 |
| 2012/0105114 A1* | 5/2012 | Yun | H03L 7/0891 327/156 |
| 2012/0242384 A1* | 9/2012 | Kato | H03L 7/097 327/157 |
| 2012/0319748 A1* | 12/2012 | Luo | H03L 7/085 327/158 |
| 2013/0027102 A1* | 1/2013 | Chen | H03K 3/03 327/158 |
| 2013/0121094 A1* | 5/2013 | Zerbe | H03L 7/091 365/194 |
| 2014/0306771 A1* | 10/2014 | Malpass | H03L 1/022 331/44 |
| 2015/0175072 A1* | 6/2015 | Sabeti | B60Q 9/008 348/148 |
| 2016/0142063 A1* | 5/2016 | Zhang | H03L 7/093 327/157 |
| 2016/0269012 A1* | 9/2016 | Takahashi | H03K 5/1534 |
| 2017/0149553 A1* | 5/2017 | Beilin | H04L 67/10 |
| 2017/0194966 A1* | 7/2017 | Yonezawa | H03B 5/362 |
| 2019/0064749 A1* | 2/2019 | Sudo | H03L 7/0805 |
| 2019/0185019 A1* | 6/2019 | Cho | B60W 50/0098 |
| 2019/0296723 A1* | 9/2019 | Tang | G11C 29/028 |
| 2019/0312581 A1* | 10/2019 | Lamanna | H03L 7/099 |
| 2019/0334521 A1* | 10/2019 | Takamori | H03K 17/0822 |
| 2020/0091898 A1* | 3/2020 | Kubota | G06F 1/04 |

* cited by examiner

SEMICONDUCTOR DEVICE AND CONTROL METHODS THEREOF

CROSS-REFERENCE TO RELATED APPLICATIONS

The disclosure of Japanese Patent Application No. 2018-172617 filed on Sep. 14, 2018 including the specification, drawings and abstract is incorporated herein by reference in its entirety.

BACKGROUND

The present invention relates to a semiconductor device and a method of controlling the semiconductor device, and to a semiconductor device and a method of controlling the semiconductor device which are suitable, for example, for carrying out the self-diagnosis of a clock monitoring circuit without increasing the circuit-scale.

For example, a semiconductor device mounted on a vehicle is required to operate normally in order to ensure safety, and related technologies are disclosed in Patent Document 1.

The semiconductor device disclosed in U.S. Pat. No. 1 comprises oscillator and oscillation abnormality detector. The oscillation abnormality detector specifies the frequency of the clock based on the count value obtained by measuring the frequency of the clock outputted from the oscillator. When the frequency is out of the predetermined frequency range, the oscillation abnormality detector outputs an abnormal oscillation signal. This allows the semiconductor device to determine whether the oscillator is operating normally.

However, the configuration disclosed in Patent Document 1 does not have the function to determine whether or not the oscillation abnormality detector is abnormal. Therefore, if the oscillation abnormality detector is abnormal, it is impossible to determine whether or not the oscillator is operating normally.

A solution to such problem is disclosed in Patent Document 2. The pulse period measuring device disclosed in Patent Document 2 includes at least an internal clock generating circuit, a free-run counter, a substitute clock generating circuit, a memory, a verification free-run counter, and an arithmetic unit.

First, before the start of measurement, the pulse period measuring device supplies a substitute clock generated by the substitute clock generating circuit to the free-run counter instead of the internal clock. The pulse period measuring device detects a failure of the free-run counter by comparing a count value of the substitute clock by the free-run counter with an integrated value of the substitute clock sequentially stored in the memory.

During the measurement period, the pulse period measuring device supplies the internal clock generated by the internal clock generating circuit to each of the free-run counter and the verification free-run counter. The pulse period measuring device detects a failure of the free-run counter by comparing the count value of the internal clock by the free-run counter with the count value of the internal clock by the verification free-run counter.

SUMMARY

However, in the configuration of Patent Document 2, in addition to the free-run counter for measuring the internal clock generated by the internal clock generating circuit (oscillator) during the measurement period, a verification-use free-run counter for measuring the internal clock in parallel with the free-run counter needs to be further provided, and therefore, the circuit size increases. Other objects and novel features will become apparent from the description of this specification and the accompanying drawings.

According to one embodiment, the semiconductor device comprises a first oscillation circuit for generating an internal clock signal, a first clock monitoring circuit, and a mode switching circuit for periodically switching an operation mode of the first clock monitoring circuit to any one of the first to third modes, the first clock monitoring circuit comprising: a first clock counter configured to count the number of oscillations of the internal clock signal in the first mode, and configured to shift pulses of the input signal to the output signal at normal times in the third mode; a first comparison circuit for comparing whether a count value per predetermined period by the first clock counter is within an expected value range in the second mode; and a first detection circuit for detecting whether or not a pulse of the input signal is shifted to an output signal of the first clock counter in the third mode.

According to another embodiment, the control method of the semiconductor device is a control method of the semiconductor device comprising a first oscillator circuit for generating an internal clock signal, a first clock monitoring circuit, and a mode switching circuit for periodically switching the operation mode of the first clock monitoring circuit to any of the first to third modes, wherein in the first mode, a counter is configured by a logic circuit provided in the first clock monitoring circuit, the counter is used to count the number of oscillations of the internal clock signal, in the second mode, whether or not the count value per predetermined period by the counter is within an expected value, and in the third mode, a shift register is configured by the logic circuit provided in the first clock monitoring circuit to detect whether or not the pulse of the input signal is shifted to the output signal of the shift register.

According to the above-mentioned embodiment, it is possible to provide a semiconductor device capable of performing self-diagnosis of a clock monitoring circuit without increasing a circuit scale and a control method thereof.

DETAILED DESCRIPTION

Figure 1:
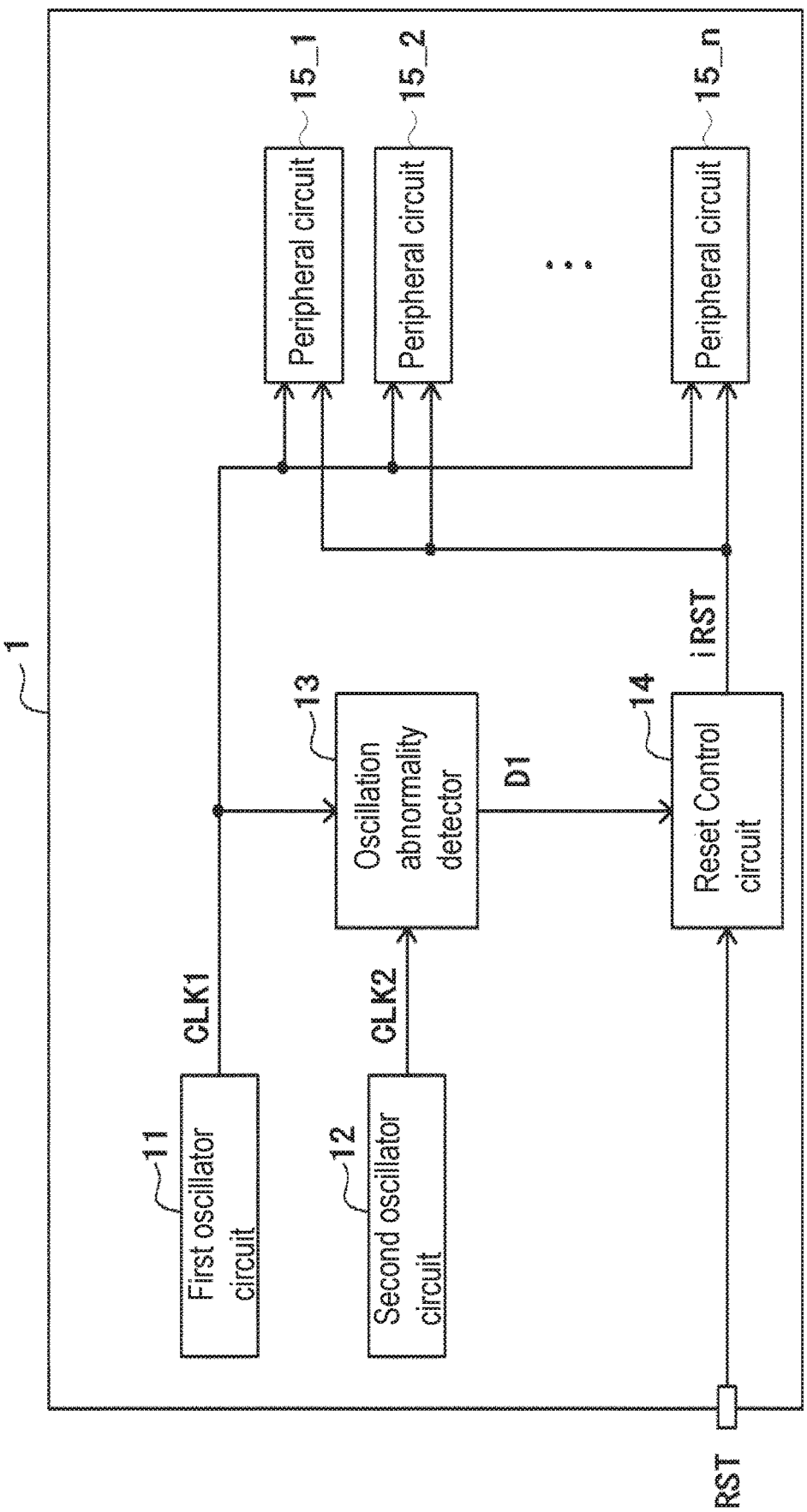
FIG. 1 is a block diagram showing an exemplary configuration of a semiconductor device according to a first embodiment.

For clarity of explanation, the following description and drawings are appropriately omitted and simplified. In addition, the respective elements described in the drawings as functional blocks for performing various processes can be configured by a CPU (Central Processing Unit), a memory, and other circuits in terms of hardware, and are realized by programs loaded in the memory in terms of software. Therefore, it is understood by those skilled in the art that these functional blocks can be realized in various forms by hardware alone, software alone, or a combination thereof, and the present invention is not limited to any of them. In the drawings, the same elements are denoted by the same reference numerals, and a repetitive description thereof is omitted as necessary.

Also, the programs described above may be stored and provided to a computer using various types of non-transitory computer readable media. Non-transitory computer readable media includes various types of tangible storage media. Examples of non-transitory computer-readable media include magnetic recording media (e.g., flexible disks, magnetic tapes, hard disk drives), magneto-optical recording media (e.g., magneto-optical disks), CD-ROM (Read Only Memory, a CD-R, a CD-R/W, solid-state memories (e.g., masked ROM, PROM (Programmable ROM), EPROM (Erasable PROM, flash ROM, RAM (Random Access Memory)). The program may also be supplied to the computer by various types of transitory computer-readable media. Examples of transitory computer-readable media include electrical signals, optical signals, and electromagnetic waves. The transitory computer readable medium may provide the program to the computer via wired or wireless communication paths, such as electrical wires and optical fibers.

First Embodiment

FIG. 1 is a block diagram showing an exemplary configuration of a semiconductor device 1 according to a first embodiment. In the semiconductor device 1 according to the present embodiment, the respective clock monitoring circuit 131 to 133 configure counters for counting the number of oscillations of the clock signal generated by the oscillation circuits according to the operation modes, and configure shift registers for detecting whether or not the pulses of the input signal are shifted to the output signal. In other words, in the semiconductor device 1 according to the present embodiment, the clock monitoring circuit 131 to 133 not only monitor the clock signal but also self-diagnosis the clock signal by using a period in which the clock signal is not monitored. Thus, unlike the related art, the semiconductor device 1 according to the present embodiment does not need to additionally provide a verifying clock monitoring circuit, and therefore, the self-diagnosis of the clock monitoring circuit 131 to 133 can be performed without increasing the circuit size. Hereinafter, a concrete description will be given.

As shown in FIG. 1, the semiconductor device 1 includes a first oscillator circuit 11, a second oscillator circuit 12, a oscillation abnormality detector 13, a Reset control circuit 14, and Peripheral circuit's 15_1 to 15-n, where n is any integer of 1 or more.

The first oscillator circuit 11 generates a clock signal CLK1. The Peripheral circuit 15_1 to 15-n operate in synchronization with the clock signal CLK1. The second oscillator circuit 12 generates a clock signal CLK2.

The oscillation abnormality detector 13 detects an anomaly in the clock signal CLK1 generated by the first oscillator circuit 11. For example, when detecting an abnormal state of the clock signal CLK1, the oscillation abnormality detector 13 activates the detection signal D1.

The Reset control circuit 14 outputs an internal reset signal iRST corresponding to the reset signal RST supplied from the outside of the semiconductor device 1 and the detection signal D 1 supplied from the oscillation abnormality detector 13. The internal reset signal iRST is inputted to the internal reset signal Peripheral circuit 15_1 to 15-n.

For example, the Reset control circuit 14 sets the internal reset signal iRST to active (L-level) in response to the reset signal RST becoming active (L-level). Further, when the detecting signal D1 becomes active (that is, when an abnormal state of the clock signal CLK1 is detected by the oscillation abnormality detector 13), the Reset control circuit 14 makes the internal reset signal iRST active (L-level) regardless of the reset signal RST. As a result, the peripheral circuit 15_1 to 15-n are turned initializing.

Figure 2:
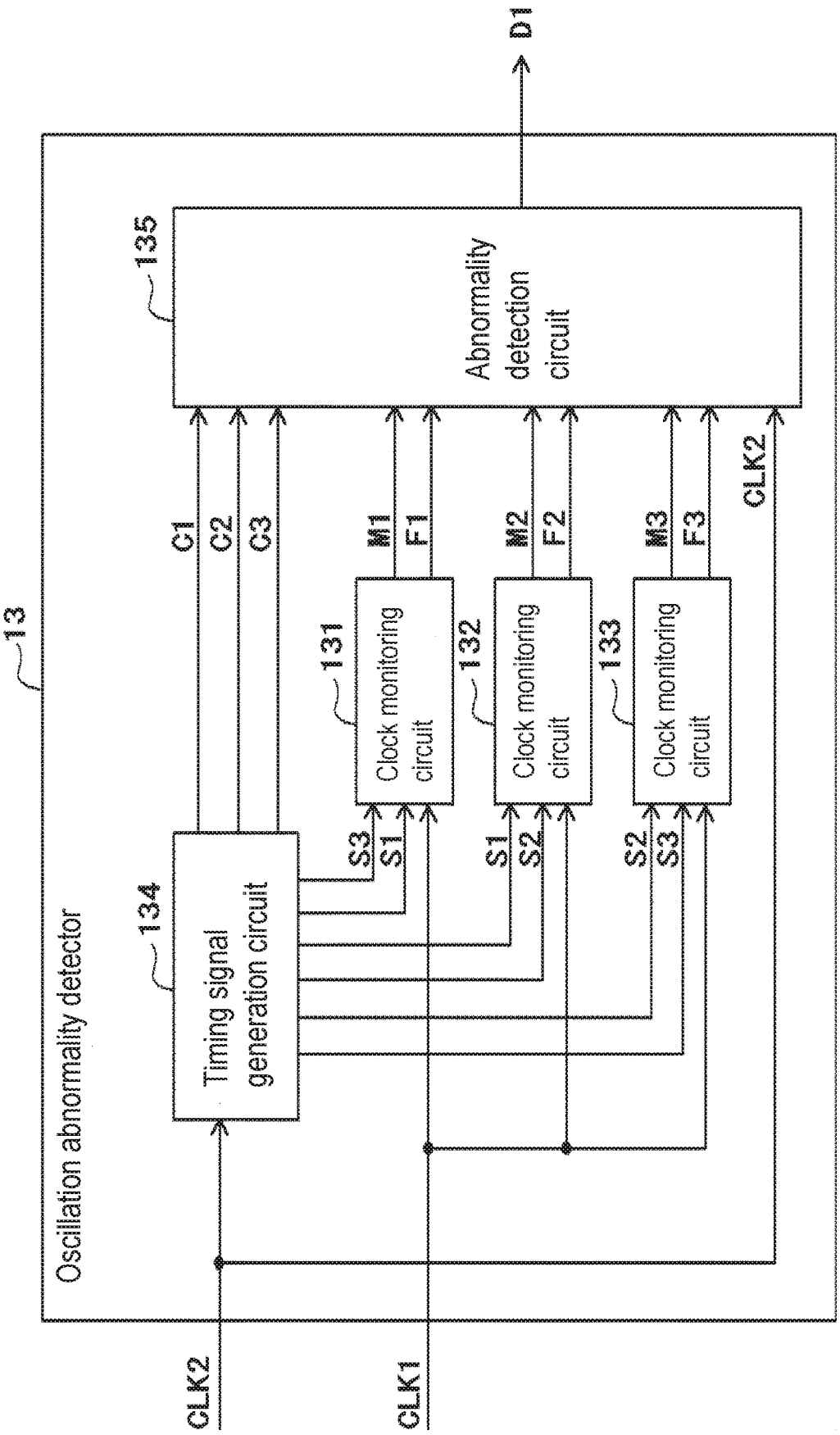
FIG. 2 is a block diagram showing a specific configuration example of a oscillation abnormality detector provided in the semiconductor device shown in FIG. 1.

FIG. 2 is a block diagram showing a specific configuration example of the oscillation abnormality detector 13. As shown in FIG. 2, the oscillation abnormality detector 13 includes clock monitoring circuit 131 to 133, a timing signal generation circuit 134, and an abnormality detection circuit 135.

Each of the clock monitoring circuit circuits 131 to 133 monitors the clock signal CLK1 generated by the first oscillator circuit 11.

The Timing signal generation circuit 134 periodically switches the operation modes of the clock monitoring circuit 131 to 133.

For example, the timing signal generation circuit 134 periodically switches the operation mode of the clock monitoring circuit 131 to one of a count mode (first mode) for counting the number of oscillations of the clock signal CLK1, a compare mode (second mode) for comparing the count signal with the expected value, and a self-diagnosis mode (third mode) for self-diagnosis the clock monitoring circuit 131. The timing signal generation circuit 134 periodically switches the operation mode of the clock monitoring circuit 132 to one of a count mode for counting the number of oscillations of the clock signal CLK1, a compare mode for comparing the count signal with an expected value, and a self-diagnosis mode for self-diagnosis the clock monitoring circuit 132. Further, the timing signal generation circuit 134 periodically switches the operation mode of the clock monitoring circuit 133 to one of a count mode in which the clock signal CLK1 is counted, a compare mode in which the count signal is compared with the expected signal, and a self-diagnosis mode in which the self-diagnosis of the clock monitoring circuit 133 is performed.

In the present embodiment, the timing signal generation circuit 134 periodically switches the operation modes of the clock monitoring circuit 131 to 133 so that the operation modes of the clock monitoring circuit 131 to 133 differ from each other. Accordingly, clock monitoring circuit 131-133 can always monitor the clock-signal CLK1 using any of them. On the other hand, in another clock monitoring circuit in which the clock signal CLK1 is not monitored, the clock signal self-diagnosis is compared with the count value and the expected value, and self-diagnosis is performed.

Specifically, the timing signal generation circuit 134 outputs the sampling signals S1 to S3 and the comparator signals C1 to C3 in synchronization with the rising edge of the clock signal CLK2.

Figure 3:
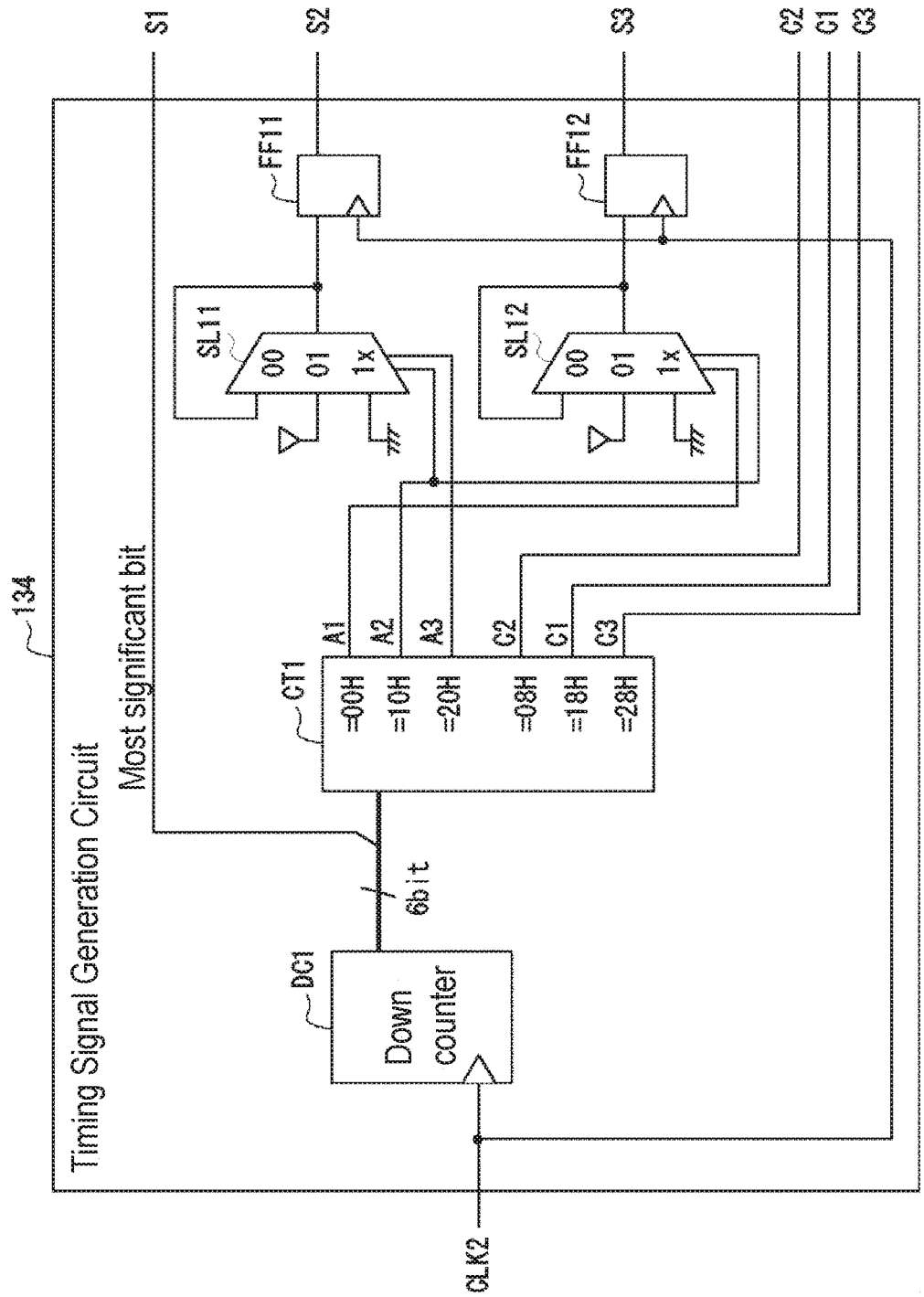
FIG. 3 is a block diagram showing a specific configuration example of a timing signal generation circuit provided in the oscillation abnormality detector shown in FIG. 2.

FIG. 3 is a diagram showing a specific configuration example of the timing signal generation circuit 134. As shown in FIG. 3, the timing signal generation circuit 134 includes a down counter DC1, a logic circuit CT1, a selector SL11,SL12, and a flip-flop FF11,FF12.

The down counter DC1 is, for example, a 6-bit counter, and counts down the count value in synchronization with the rising edge of the clock signal CLK2. In the present embodiment, the down counter DC 1 counts down the count value one by one from the maximum value "2Fh" (in hexadecimal notation; 47 in decimal notation) to the minimum value "00h". When the count value reaches the minimum value "00h", the count value returns to the maximum value "2Fh".

The down counter DC1 outputs the value of most significant bit among the 6-bit values constituting the count value as the sampling signal S1.

The logic circuit CT1 outputs the selection signals A1 to A3 and the comparing signals C1 to C3 based on the counted values of the down counter DC1. Specifically, the logic circuit CT1 temporarily sets the selection signal A1 to the H-level when the count value of the down counter DC1 is "00h", temporarily sets the selection signal A2 to the H-level when the count value is "10h", and temporarily sets the selection signal A3 to the H-level when the count value is "20h". The logic circuit CT1 temporarily sets the comparison signal C2 to H-level when the count value of the down counter DC1 is "08h", temporarily sets the comparison signal C1 to H-level when the count value is "18h", and temporarily sets the comparison signal C3 to H-level when the count value is "28h".

The selector SL11 selects and outputs one of an H-level signal, an L-level signal, and an output signal of the selector SL11 based on the selection signals A2 and A3. Specifically, when both of the selection signals A2 and A3 indicate L-level, the selector SL11 selects and outputs the output signal of the selector SL11, i.e., maintains the output signal. When the selection signal A2 is at L-level and the selection signal A3 is at H-level, the selector SL11 selects and outputs a signal at H-level. Further, when the selection signal A2 indicates the H-level, the selector SL11 selects and outputs the L-level signal regardless of the selection signal A3.

The flip-flop FF11 fetches the output signal of the selector SL11 in synchronization with the rising edge of the clock signal CLK2, and outputs the fetched output signal as the Sampling signal S2.

The selector SL12 selects and outputs one of an H-level signal, an L-level signal, and an output signal of the selector SL12 based on the selection signals A1 and A2. Specifically, when both of the selection signals A1 and A2 indicate L-level, the selector SL12 selects and outputs the output signal of the selector SL11, i.e., maintains the output signal. When the selection signal A1 indicates L-level and the selection signal A2 indicates H-level, the selector SL11 selects and outputs a signal of H-level. Further, when the selection signal A1 indicates H-level, the selector SL11 selects and outputs a signal of L-level regardless of the selection signal A2.

The flip-flop FF12 fetches the output signal of the selector SL12 in synchronization with the rising edge of the clock signal CLK2, and outputs the fetched output signal as the sampling signal S3.

With such a configuration, the timing signal generation circuit 134 sequentially sets the sampling signals S1 to S3 to the H-level for a predetermined period, and temporarily sets the comparator signals C1 to C3 to the H-level after the elapse of the period in which the sampling signals S1 to S3 indicate the H-level, respectively.

Note that the Timing signal generation circuit 134 can be appropriately changed to another configuration having a function equivalent to the above-described configuration.

Figure 4:
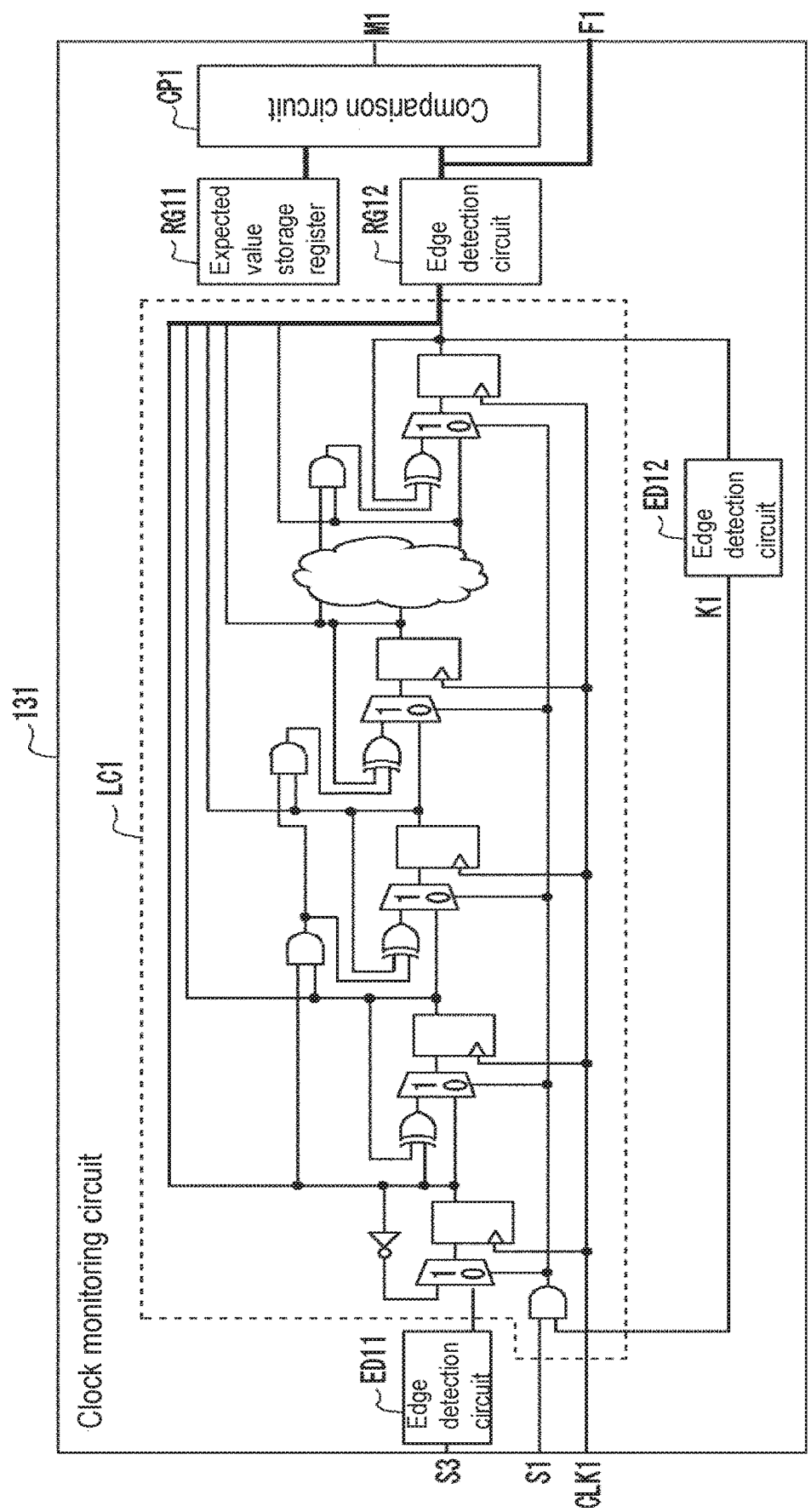
FIG. 4 is a diagram showing a specific configuration of a clock monitoring circuit provided in the oscillation abnormality detector shown in FIG. 2.

FIG. 4 is a diagram showing a specific configuration example of the clock monitoring circuit 131. As shown in FIG. 4, the Clock monitoring circuit 131 includes a Edge detection circuit ED11, a Logic circuit (clock counter) LC1, a Edge detection circuit ED12, a Expected value storage register RG11, a measured value storage register RG12, and a comparison circuit CP1.

The edge detection circuit ED11 detects rising edges of the sampling signal S3 and outputs a pulsed signal.

The Logic circuit LC1 includes m flip-flops (m is an integer equal to or greater than 2) connected in cascade, m selectors, and combinational circuits. Each of the m selectors is provided in a preceding stage of the m flip-flops, and selectively outputs a signal inputted to the m flip-flops in accordance with an operation mode (specifically, a logical product of the sampling signal S1 and the self-diagnosis successful signal K1).

For example, when the sampling signal S1 indicates the L-level, or when the self-diagnosis successful signal K1 indicates the L-level, the first-stage selectors select and output the pulse signal output from the Edge detection circuit ED11 to the first-stage flip-flops. The selector in the k-th stage (k is an arbitrary integer of 2 to m) in the second and subsequent stages selects and outputs the output signal of the flip-flop in the preceding stage (k−1-th stage) with respect to the flip-flop in the k-th stage. That is, when the sampling signal S1 indicates the L-level, or when the self-diagnosis successful signal K1 indicates the L-level, the Logic circuit LC1 configures the shift register. The shift register shifts (propagates) the pulse signal output from the edge detection circuit ED11 to the output signal when the pulse signal is normally output.

For example, when the sampling signal S1 indicates the H-level and the Self-diagnosis successful signal K1 indicates the H-level, the first-stage selector selects and outputs a signal obtained by inverting the output signal of the first-stage flip-flop to the first-stage flip-flop. The selector of the k-th stage after the second stage selects and outputs to the flip-flop of the k-th stage an exclusive OR of the output signal of the flip-flop of the k-th stage and the AND of the output signals of the flip-flops of the first stage to the k−1-th stage. That is, when the Sampling signal S1 indicates the H-level and the self-diagnosis successful signal K1 indicates the H-level, the logic circuit LC1 configures a binary counter. The binary counter outputs the respective output signals of the plurality of flip-flops as the count values (measured value) of the binary counter.

The edge detection circuit ED12 detects whether or not the pulse of the input signal (the pulse signal output from the edge detection circuit ED11) is normally shifted to the output signal of the shift register formed by the logic circuit LC1.

For example, the edge detection circuit ED12 sets the self-diagnosis successful signal K1 to the H-level when it detects that the pulse of the input signal is shifting to the output signal of the shift register. This means that the logic circuit LC1 has not failed. In addition, the edge detection circuit ED12 sets the self-diagnosis successful signal K1 to the L-level when the pulse of the input signal is not shifted to the output signal of the shift register. This means that the logic circuit LC1 has failed.

The measured value storage register RG12 stores a count value (measured value) F1 per predetermined period of the binary counter constituted by the logic circuit LC1. The expected value storage register RG11 stores the largest and smallest expected values in advance.

The comparison circuit CP1 compares whether or not the count value stored in the measured value storage register RG12 is within the expected value stored in the expected value storage register RG11, for example, in synchronization with the rise of the comparison signal C1, and outputs the comparison result as the monitoring result M1 of the clock signal CLK1. For example, the comparison circuit CP1 outputs the monitoring result M1 of the L-level when the count value is within the range of the expected value, and outputs the monitoring result M1 of the H-level when the count value is outside the range of the expected value.

Note that the configuration of the clock monitoring circuit 131 can be appropriately changed to another configuration having a function equivalent to the above-described configuration.

Since the specific configuration of the clock monitoring circuit 132 is the same as that of the clock monitoring circuit 131, its explanation is omitted. However, in the clock monitoring circuit 132, the sampling signal S1 is input instead of the sampling signal S3, the sampling signal S 2 is input instead of the sampling signal S1, the monitoring result M2 is output in synchronization with the comparison signal C2 instead of the monitoring result M1 being output in synchronization with the comparison signal C1, the count value F2 is output in place of the count value F1, and the self-diagnosis success signal K2 is generated in place of the self-diagnosis success signal K1. The clock monitoring circuit 132 is provided with a logic circuit LC2 corresponding to the logic circuit LC1.

Since the specific configuration of the clock monitoring circuit 133 is the same as that of the clock monitoring circuit 131, its explanation is omitted. However, in the clock monitoring circuit 132, the sampling signal S2 is input instead of the sampling signal S3, the sampling signal S3 is input instead of the sampling signal S1, the monitoring result M3 is output in synchronization with the comparison signal C3 instead of the monitoring result M1 being output in synchronization with the comparison signal C1, the count value F3 is output in place of the count value F1, and the self-diagnosis success signal K3 is generated in place of the self-diagnosis success signal K1. The clock monitoring circuit 133 is provided with a logic circuit LC3 corresponding to the logic circuit LC1.

The abnormality detection circuit 135 detects an anomaly in the clock signal CLK1 generated by the first oscillator circuit 11 based on the monitoring results M1 to M3 and the measured value signals F1 to F3 outputted from the clock monitoring circuit 131 to 133. For example, when an abnormality of the clock signal CLK1 generated by the first oscillator circuit 11 is not detected, the detection signal D1 of L-level is output, and when an abnormality is detected, the detection signal D1 of H-level is output. Further, the abnormality detection circuit 135 detects the failure of the clock monitoring circuit 131-133 based on the monitoring results M1-M3 and the measured value F1-F3.

Figure 5:
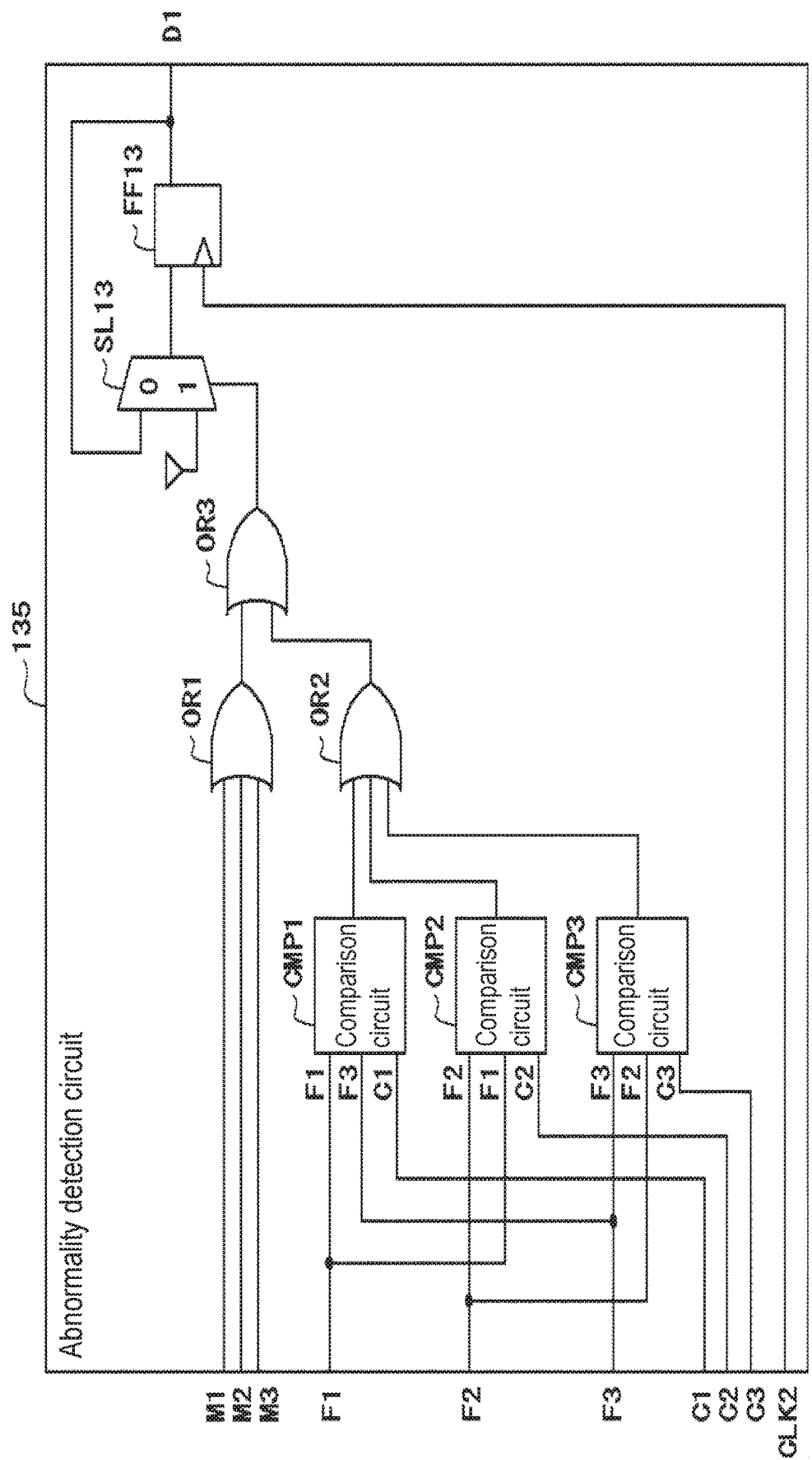
FIG. 5 is a diagram showing an exemplary configuration of an abnormality detection circuit provided in the oscillation abnormality detector shown in FIG. 2.

FIG. 5 is a diagram showing a specific configuration example of the abnormality detection circuit 135. As shown in FIG. 5, the abnormality detection circuit 235 includes comparison circuit CMP1 to CMP3, OR circuits OR1-OR3, selectors SL13, and flip-flops FF13.

The comparison circuit CMP1 compares the count value per predetermined period (measured value) F1 counted by the clock counter of the clock monitoring circuit 131 with the count value per predetermined period (measured value) F3 counted by the clock counter of the clock monitoring circuit 133 in synchronization with the rise of the comparison signal C1.

The comparison circuit CMP2 compares the count value per predetermined period (measured value) F1 counted by the clock counter of the clock monitoring circuit 131 with the count value per predetermined period (measured value) F2 counted by the clock counter of the clock monitoring circuit 132 in synchronization with the rise of the comparison signal C2.

The comparison circuit CMP3 compares the count value per predetermined period (measured value) F2 counted by the clock counter of the clock monitoring circuit 132 with the count value per predetermined period (measured value) F3 counted by the clock counter of the clock monitoring circuit 133 in synchronization with the rise of the comparison signal C3.

The OR-circuit OR1 outputs a logical OR of the monitoring results M1 to M3 by the Clock monitoring circuit 131 to 133, respectively. The OR-circuit OR2 outputs a logical sum of the results of comparisons by the comparison circuit CMP1 to CMP3, respectively. The OR circuit OR3 outputs the OR of the outputs of the OR circuit OR1,OR2. The selector SL13 selects and outputs either the output signal of the flip-flop FF13 or the H-level signal in accordance with the output signal of the OR circuit OR3. The flip-flop FF13 fetches the output signal of the selector SL13 in synchronization with the rising edge of the clock signal CLK2, and outputs the fetched output signal as the detecting signal D 1.

Note that the configuration of the abnormality detection circuit 135 can be appropriately changed to another configuration having a function equivalent to the above-described configuration.

Figure 6:
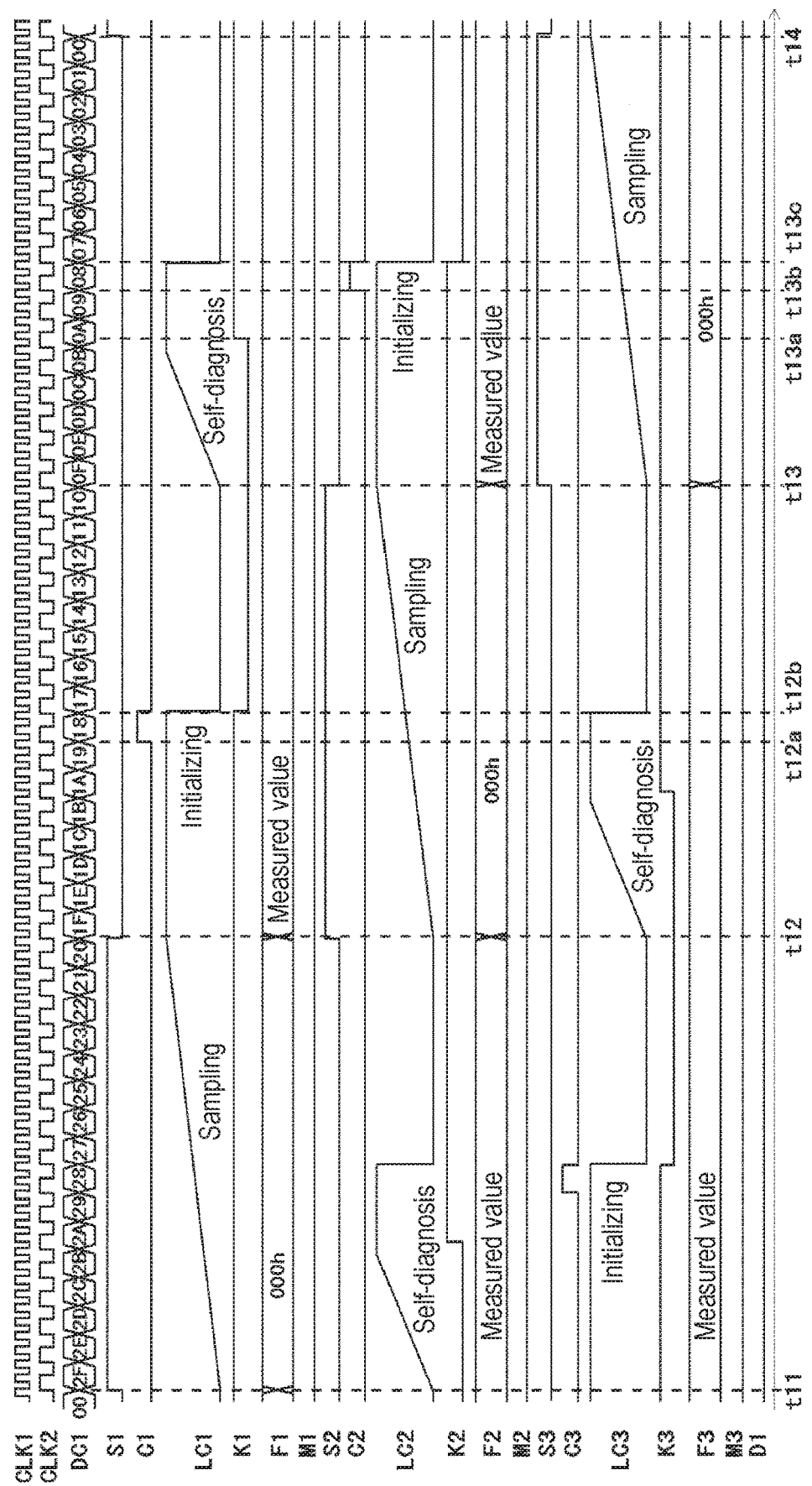
FIG. 6 is a timing chart illustrating the operation of the semiconductor device shown in FIG. 1.

Next, the operation of the semiconductor device 1 will be described with reference to FIG. 6. FIG. 6 is a timing chart showing the operation of the semiconductor device 1.

As shown in FIG. 6, the clock monitoring circuit 131 to 133 are controlled so that their operation modes differ from each other.

Specifically, in the period from time t11 to time t12, the clock monitoring circuit 131 counts the number of oscillations (sampling) of the clock signal CLK1, the clock monitoring circuit 132 performs self-diagnosis, and the clock monitoring circuit 133 compares the count value per predetermined period of the clock signal CLK1 counted in the immediately preceding period with the expected value.

Thereafter, in the period from time t12 to time t13, the clock monitoring circuit 131 compares the count value per predetermined period of the clock signal CLK1 counted in the immediately preceding period with the expected value, the clock monitoring circuit 132 counts the number of oscillations (sampling) of the clock signal CLK1, and the clock monitoring circuit 133 performs self-diagnosis.

Thereafter, in the period from time t13 to time t 14, the clock monitoring circuit 131 performs self-diagnosis, the clock monitoring circuit 132 compares the count value per predetermined period of the clock signal CLK1 counted in the immediately preceding period with the expected value, and the clock monitoring circuit 133 performs counting (sampling) of the number of oscillations of the clock signal CLK1.

Here, clock monitoring circuit 131-133 constantly monitors the clock-signal CLK1 using any of them. On the other hand, in another clock monitoring circuit in which the clock signal CLK1 is not monitored, the clock signal self-diagnosis is compared with the count value and the expected value, and self-diagnosis is performed.

Hereinafter, the operation of the semiconductor device 1 will be described in more detail. Although the operation of the clock monitoring circuit 131 among the clock monitoring circuit 131 to 133 will be mainly described below, the operation of the clock monitoring circuit 132 and 133 is basically the same as the operation of the clock monitoring circuit 131 except that the operation timings differ.

First, when the count value of the down counter DC1 is initializing from "00h" to "2Fh" (i.e., when the value of the most significant bit of the count value changes from "0" to "1"), the sampling signal S1 is switched from the L-level to the H-level (time t11). As a result, the clock monitoring circuit 131 starts counting the number of oscillations of the clock signal CLK1 at time t11.

At this time, in the clock monitoring circuit 131, since the sampling signal S1 indicates the H-level and the self-diagnosis successful signal K1 indicates the H-level, a binary counter is configured by the logic circuit LC1.

Thereafter, when the count value of the down counter DC1 is counted down to become "1Fh" (i.e., when the value of the most significant bit of the count value changes from "1" to "0"), the sampling signal S1 is switched from the H-level to the L-level (time t12). Thereby, the measurement of the clock signal CLK1 by the binary counter configured by the Logic circuit LC1 is finished, and the measured value of the clock signal is stored in the measured value storage register RG12.

Thereafter, when the count value of the down counter DC1 is counted down to "18h", the comparator signal C1 temporarily becomes H-level (time t12a).

As a result, the comparison circuit CP1 provided in the clock monitoring circuit 131 compares the measured value F1 stored in the measured value storage register RG12 with the expected value stored in the expected value storage register RG11, for example, in synchronization with the rising edge of the comparison signal C1 (time t12a). In the case of FIG. 6, the comparison circuit CP1 outputs an L-level monitoring result M1 indicating that the measured value F1 is within the expected range.

At this time, the comparison circuit CMP1 provided in the abnormality detection circuit 135 compares the measured value F1 output from the clock monitoring circuit 131 with the measured value F3 output from the clock monitoring circuit 133 in synchronization with the rise of the comparison signal C1. For example, when the measured value F1 and the measured value F3 coincide with each other, the comparison circuit CMP1 outputs the L-level comparison result. In the case of FIG. 6, not only the monitoring result M1 but also the monitoring results M2 and M3 indicate the L-level, and the respective comparative results of the comparison circuit CMP1 to CMP3 indicate the L-level, so that the abnormality detection circuit 135 outputs the L-level detecting signal D1 indicating that there is no abnormality in the clock signal CLK1 (and there is no failure in the clock monitoring circuit 131 to 133).

Thereafter, in synchronization with the falling edge of the comparing signal C1, the count value of the binary counter constituted by the Logic circuit LC1 is initializing to "0", and the self-diagnosis success signal K1 is switched from the H-level to the L-level (time t12b).

When the Measured value F1 is out of the expected range in the clock monitoring circuit 131, the comparison circuit CP1 outputs the monitoring result M1 of the H-level in synchronization with the rise of the comparing signal C1, for example. At this time, the abnormality detection circuit 135 outputs the H-level detecting signal D1 indicating that the clock signal CLK1 is abnormal.

When the measured value F1 and the measured value F3 do not coincide with each other in the abnormality detection circuit 135, the comparison circuit CMP1 outputs the H-level comparison result in synchronization with the rise of the comparison signal C1. At this time, the abnormality detection circuit 135 outputs the H-level detecting signal D1 indicating that the clock signal CLK1 is abnormal.

Thereafter, when the count value of the down counter DC1 is counted down to "10h", the selection signal A 2 is temporarily set to the H-level, so that the sampling signal S3 is switched from the L-level to the H-level (time t 13). As a result, the clock monitoring circuit 131 starts the self-diagnosis operation at time t13.

At this time, in the clock monitoring circuit 131, since the sampling signal S1 indicates L-level, the shift register is configured by the logic circuit signal LC1. By detecting the rising edge of the sampling signal S3, the shift register shifts the pulse signal output from the Edge detection circuit ED11 to the output signal from time t13 to t13a.

In FIG. 6, since the pulses of the input signal are normally shifted to the output signal of the shift register formed by the logic circuit LC1, the edge detection circuit ED12 switches the self-diagnosis success signal K1 from the L-level to the H-level (time t13a).

Thereafter, when the count value of the down counter DC1 is counted down to "08h", the comparator signal C2 is temporarily set to H-level. For example, the self-diagnosis successful signal K1 is outputted to the outside in synchronization with the rising edge of the comparing signal C2 (time t13b). Thereafter, in synchronization with the falling edge of the comparing signal C2, the value of the output signal of the shift register constituted by the logic circuit LC1 is initializing to "0" (time t13c).

Thereafter, when the count value of the down counter DC1 reaches "00h", the count value is initializing to "2Fh" (time t14). Thereafter, the operations from time t11 to t14 are repeated.

When the pulse of the input signal is not normally shifted to the output signal of the shift register formed by the logic circuit LC1 in the clock monitoring circuit 131, the edge detection circuit ED12 maintains the self-diagnosis success signal K1 at the L-level. In the subsequent count mode, even if the sampling signal S1 is switched from the L-level to the H-level, the logic circuit signal LC1 maintains the configuration of the shift register without switching to the configuration of the binary counter. That is, the clock monitoring circuit 131 does not count the number of oscillations of the clock signal CLK1 in the count mode. As a result, in the subsequent comparison mode, since the measured value F1 is out of the expected range, the clock monitoring circuit 131 outputs the monitoring result M1 of the H-level from the comparison circuit CP1. At this time, the abnormality detection circuit 135 outputs an H-level detecting signal D1 indicating that the clock monitoring circuit 131 has a failure.

As described above, in the semiconductor device 1 according to the present embodiment, the clock monitoring circuit 131 to 133 configure counters for counting the number of oscillations of the clock signal CLK1 generated by the first oscillator circuit 11 according to the operation modes, and configure a shift register for detecting whether or not the pulses of the input signal are shifted to the output signal. In other words, in the semiconductor device 1 according to the present embodiment, the clock monitoring circuit 131 to 133 not only monitor the clock signal CLK1, but also self-diagnosis the clock signal CLK1 by using a period in which the clock signal CLK1 is not monitored. As a result, the semiconductor device 1 according to the present embodiment does not need to additionally provide a verifying clock monitoring circuit, unlike the related art, and therefore, the self-diagnosis of the clock monitoring circuit 131 to 133 can be performed without increasing the circuit size.

In the present embodiment, the timing signal generation circuit 134 periodically switches the operation modes of the clock monitoring circuit 131 to 133 so that the operation modes of the clock monitoring circuit 131 to 133 differ from each other. Accordingly, clock monitoring circuit 131-133 can always monitor the clock-signal CLK1 using any of them.

Furthermore, the semiconductor device 1 according to the present embodiment can monitor the CLK1 of clock signals by comparing the monitoring results of the clock monitoring circuit 131 to 133 with each other. However, comparisons of the monitoring results by the clock monitoring circuit 131 to 133 may be omitted. In this instance, the abnormality detection circuit 135 outputs the detection signal D1 based only on the monitoring results M1 to M3 of the clock monitoring circuit 131 to 133.

In the present embodiment, three clock monitoring circuit 131 to 133 are provided, but the present invention is not limited thereto. Only one clock monitoring circuit 131 may be provided, as long as the clock signal CLK1 does not need to be constantly monitored and may be regularly monitored.

Figure 7:
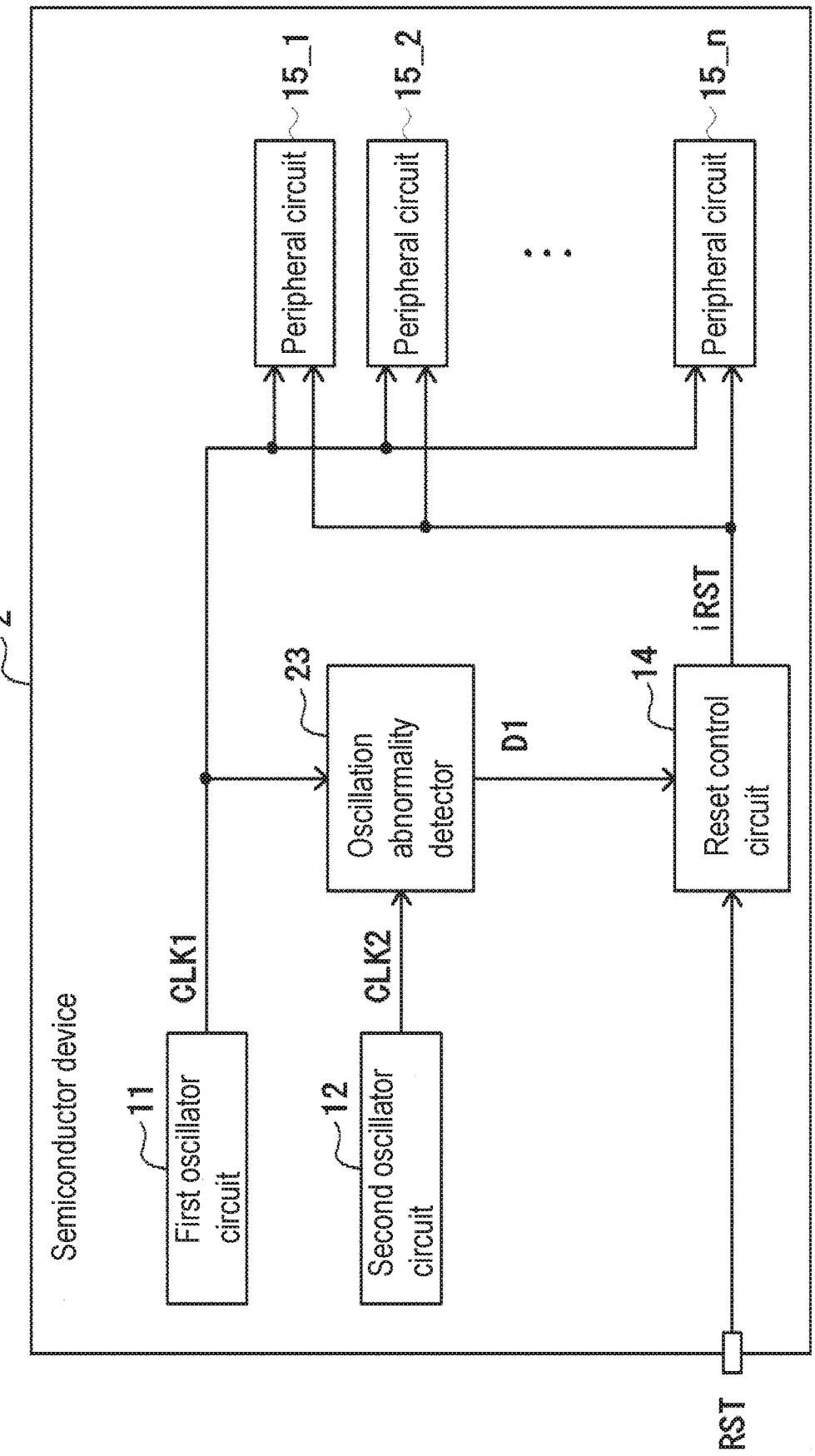
FIG. 7 is a block diagram illustrating a configuration example of a semiconductor device according to the second embodiment.

FIG. 7 is a block diagram showing an exemplary configuration of a semiconductor device 2 according to a second embodiment. The semiconductor device 2 comprises a oscillation abnormality detector 23 instead of the oscillation abnormality detector 13 as compared to the semiconductor device 1.

Figure 8:
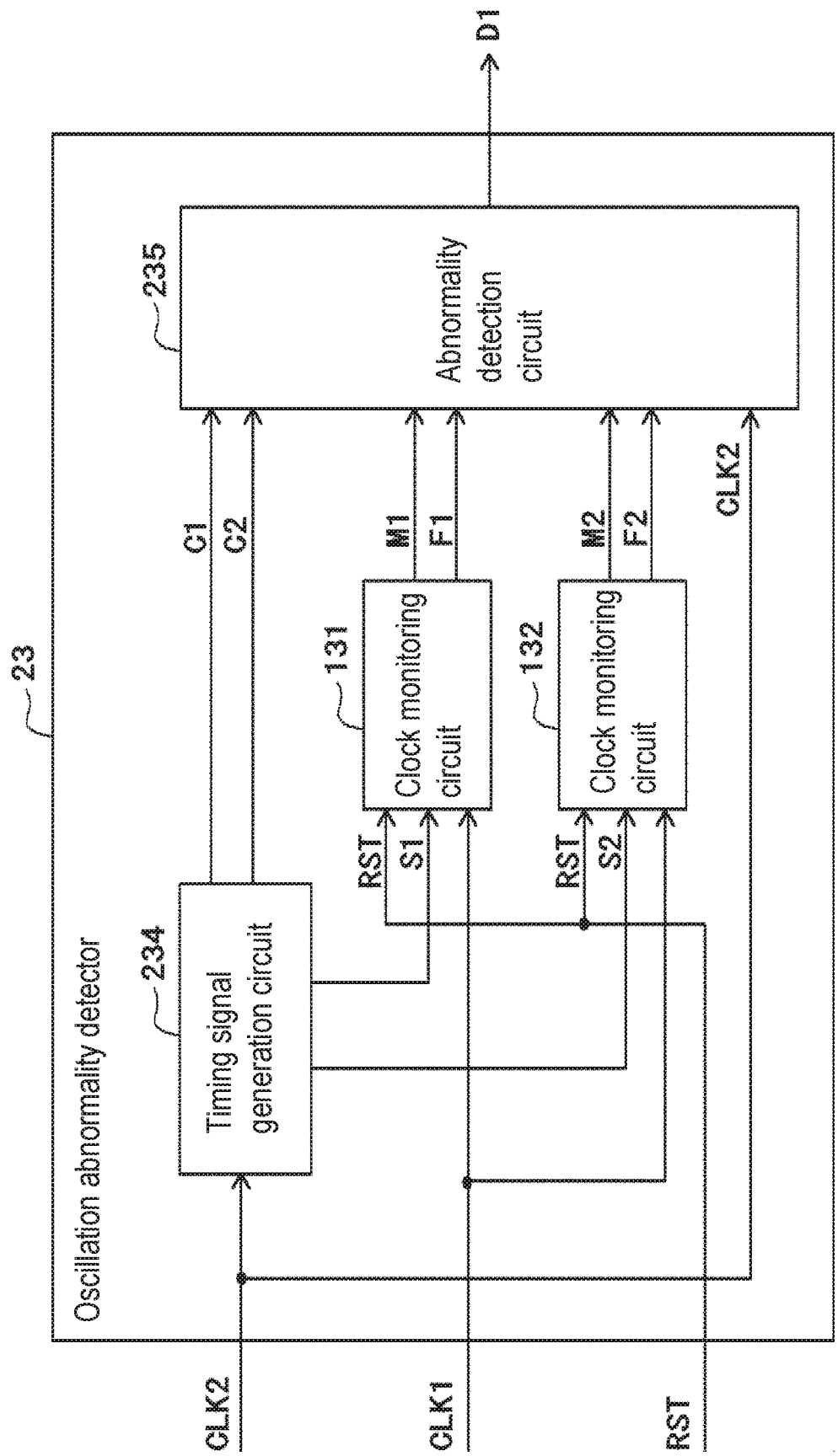
FIG. 8 is a block diagram showing a configuration example of an oscillation abnormality detector provided in the semiconductor device shown in FIG. 7.

FIG. 8 is a block diagram showing a specific configuration example of the oscillation abnormality detector 23. As shown in FIG. 8, the oscillation abnormality detector 23 includes the timing signal generation circuit 234 instead of the timing signal generation circuit 134, the abnormality detection circuit 235 instead of the abnormality detection circuit 135, and only two clock monitoring circuit 131 and 132 out of the three clock monitoring circuit 131 to 133, as compared with the oscillation abnormality detector 13.

The timing signal generation circuit 234 periodically switches the operation modes of the clock monitoring circuit 131 and 132. Specifically, the timing signal generation circuit 234 outputs the sampling signals S1 and S2 and the comparing signals C1 and C2 in synchronization with the rising edge of the clock signal CLK2.

The down counter DC1 provided in the timing signal generation circuit 234 is, for example, a 5-bit counter, and counts down the count value in synchronization with the rising edge of the clock signal CLK2. In the present embodiment, the down counter DC1 counts down the count value one by one from the maximum value "1Fh" (in hexadecimal notation; 31 in decimal notation) to the minimum value "00h". When the count value reaches the minimum value "00h", the count value returns to the maximum value "1Fh".

The Timing signal generation circuit 234 is configured to output the value of most significant bit of the 5-bit value constituting the count value of the down counter DC1 as the Sampling signal S1. The timing signal generation circuit 234 is configured to raise the sampling signal S2 when the count value of the down counter signal DC1 becomes "0Fh". Further, the timing signal generation circuit 234 is configured to temporarily set the comparison signals C1 and C2 to H-level at timings when the count values of the down counter DC1 become "08h" and "18h", respectively.

The clock monitoring circuit 131 receives a reset signal RST instead of the sampling signal S3. Therefore, the edge detection circuit ED11 provided in the clock monitoring circuit 131 detects the rising edge of the reset signal RST instead of the sampling signal S3, and outputs the pulse signal P1.

The clock monitoring circuit 132 receives a reset signal RST instead of the sampling signal S1. Therefore, a edge detection circuit (a circuit corresponding to the edge detection circuit ED11) provided in the clock monitoring circuit 132 detects the rising edge of the reset signal RST instead of the sampling signal S1, and outputs the pulse signal (P1).

Therefore, the operation modes of the clock monitoring circuit 131 and 132 are set to the self-diagnosis mode while the initializing is performed by the reset signal RST. Thereafter, the operation modes of the clock monitoring circuit 131 and 132 are periodically switched so as to be mutually different modes among the count mode and the compare mode.

The abnormality detection circuit 235 detects an error in the clock signal CLK1 generated by the first oscillator circuit 11 based on the monitoring results M1, M2 and measured value F1, F2 by the clock monitoring circuit 131, 132, respectively. For example, when the clock signal CLK1 generated by the first oscillator circuit 11 is normal, the detection signal D1 of L-level is output, and when an abnormality of the clock signal CLK1 is detected, the detection signal D1 of H-level is output. Further, the Abnormality detection circuit 235 detects a failure of the clock monitoring circuit 131 or 132 based on the monitoring results M1 or M2 and the measured value F1 or F2.

Figure 9:
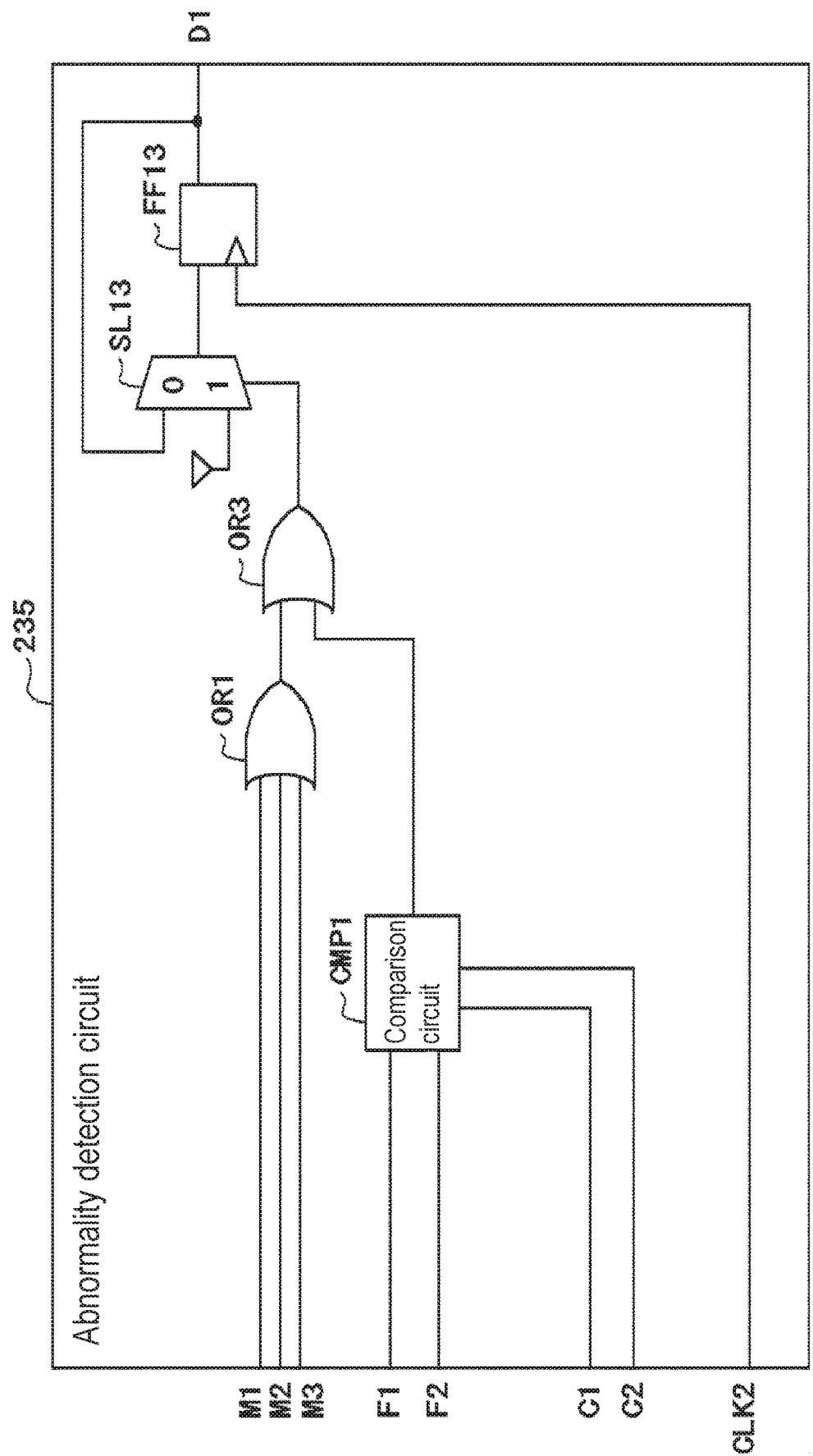
FIG. 9 is a diagram showing an exemplary configuration of an abnormality detection circuit provided in the oscillation abnormality detector shown in FIG. 8.

FIG. 9 is a diagram showing a specific configuration example of the abnormality detection circuit 235. As shown in FIG. 9, the abnormality detection circuit 235 includes a comparison circuit CMP1, an OR circuit OR1,OR3, a selector SL13, and a flip-flop circuit FF13.

The comparison circuit CMP1 compares the count value per predetermined period (measured value) F1 counted by the clock counter of the clock monitoring circuit 131 and the count value per predetermined period (measured value) F2 counted by the clock counter of the clock monitoring circuit 132 in synchronization with the rising edges of the comparison signal C1 and the comparison signal C2.

The logical sum circuit OR1 outputs the logical sum of the monitoring results M1 and M2 by the clock monitoring circuit 131 and 132, respectively. The OR circuit OR3 outputs a logical sum of an output of the OR circuit OR1 and a result of comparing by the comparison circuit CMP1. The selector SL13 selects and outputs either the output signal of the flip-flop FF13 or the H-level signal in accordance with the output signal of the OR circuit OR3. The flip-flop FF13 fetches the output signal of the selector SL13 in synchronization with the rising edge of the clock signal CLK2, and outputs the fetched output signal as the detecting signal D 1.

Note that the configuration of the abnormality detection circuit 235 can be appropriately changed to another configuration having a function equivalent to the above-described configuration.

Since the rest of the configuration of the oscillation abnormality detector 23 is the same as that of the oscillation abnormality detector 13, its explanation is omitted.

Figure 10:
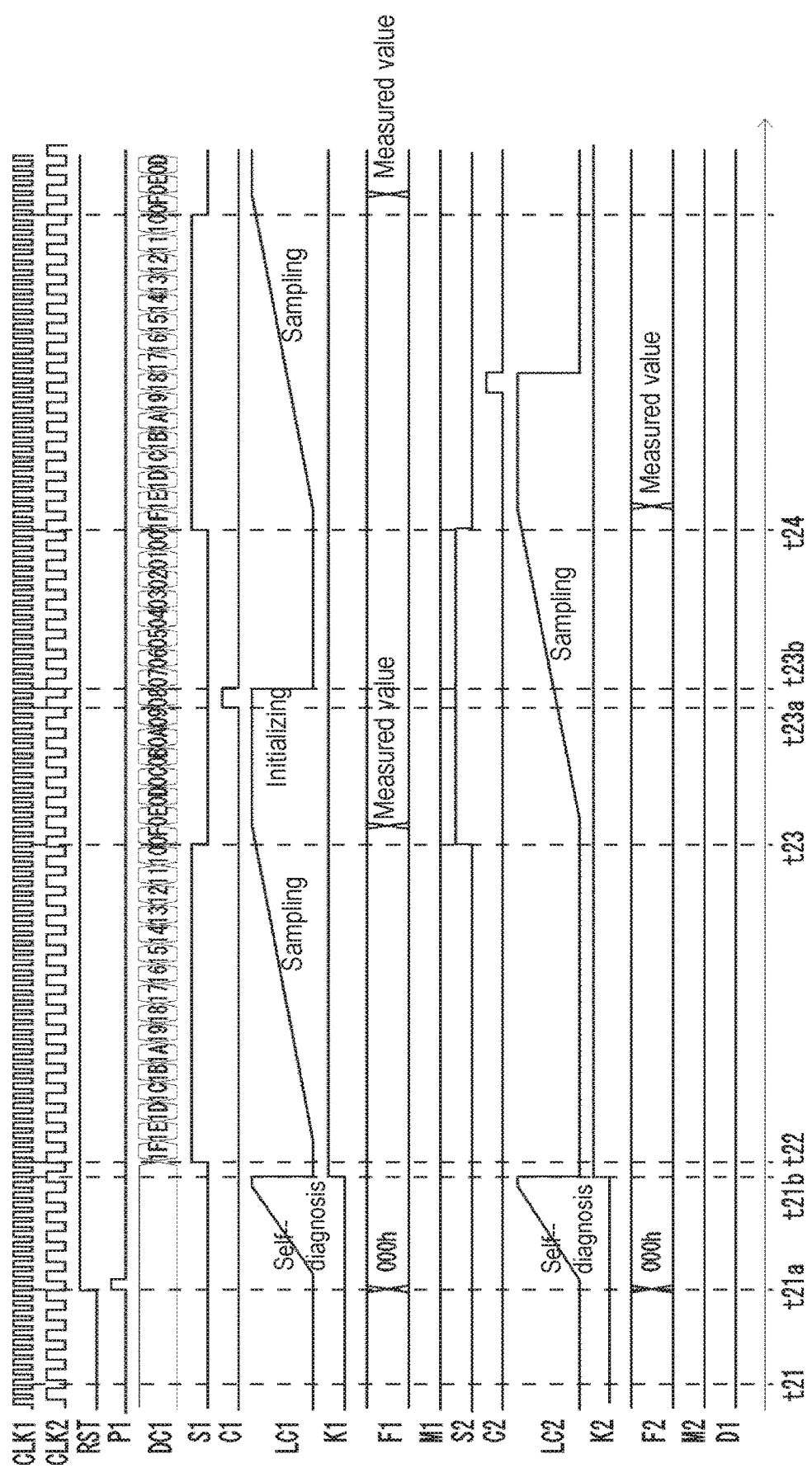
FIG. 10 is a timing chart illustrating the operation of the semiconductor device shown in FIG. 7.

Next, the operation of the semiconductor device 2 will be described with reference to FIG. 10. FIG. 10 is a timing chart showing the operation of the semiconductor device 2.

As shown in FIG. 10, first, during the period from time t 21 to time t 22, both the clock monitoring circuit 131 and 132 are self-diagnosis. Thereafter, after time t22, the clock monitoring circuit 131, 132 alternately counts (sampling) the number of oscillations of the clock signal CLK1. While one of the clock monitoring circuit 131 and 132 counts the number of oscillations of the clock signal CLK1, the other compares the count value per predetermined period of the clock signal CLK1 counted immediately before with the expected value.

Hereinafter, the operation of the semiconductor device 2 will be described in more detail. Although the operation of the clock monitoring circuit 131 among the clock monitoring circuit 131 and 132 will be mainly described below, the operation of the clock monitoring circuit 132 is basically the same as the operation of the clock monitoring circuit 131 except that the operation timings differ.

First, both of the sampling signals S1 and S2 are at L-level at time t21. Therefore, each of the clock monitoring circuit 131 and 132 performs the self-diagnosis operation from time t21 to time t22.

At this time, in the clock monitoring circuit 131, since the sampling signal S1 indicates L-level, the shift register is configured by the logic circuit signal LC1. The shift register detects the rising edge of the reset signal RST to shift the pulse signal (P1) output from the edge detection circuit ED11 to the output signal (time t21a-t21b).

In FIG. 10, since the pulses of the input signal are normally shifted to the output signal of the shift register formed by the Logic circuit LC1, the edge detection circuit ED12 switches the self-diagnosis success signal K1 from the L-level to the H-level (time t21b).

At this time, in the clock monitoring circuit 132, since the sampling signal S2 indicates L-level, the shift register is configured by the logic circuit signal LC2. This shift register shifts the pulse signal (P1) output from the edge detection circuit (a circuit corresponding to the edge detection circuit ED11) to the output signal by detecting the rising edge of the reset signal RST (time t21a-t21b).

In FIG. 10, since the pulses of the input signal are normally shifted to the output signal of the shift register constituted by the logic circuit LC2, the circuits corresponding to the edge detection circuit ED12 switch the Self-diagnosis success signal K2 from the L-level to the H-level (time t21b).

When the pulse of the input signal is not normally shifted to the output signal of the shift register formed by the logic circuit LC1 in the clock monitoring circuit 131, the edge detection circuit ED12 maintains the self-diagnosis success signal K1 at the L-level. In the subsequent count mode, even if the sampling signal S1 is switched from the L-level to the H-level, the Logic circuit signal LC1 maintains the configuration of the shift register without switching to the configuration of the binary counter. That is, the clock monitoring circuit 131 does not count the number of oscillations of the clock signal CLK1 in the count mode. As a result, since the measured value F1 is out of the expected range in the subsequent comparison mode, the clock monitoring circuit 131 outputs the H-level monitoring result M1. At this time, the abnormality detection circuit 235 outputs the H-level detecting signal D1 indicating that the clock monitoring circuit 131 has a failure.

Similarly, in the clock monitoring circuit 132, if the pulses of the input signal have not shifted normally to the output signal of the shift register configured by the logic circuit LC2, the circuits corresponding to the edge detection circuit ED12 maintain the self-diagnosis success signal K2 at L-level. In the subsequent count mode, even if the sampling signal S2 is switched from the L-level to the H-level, the Logic circuit signal LC2 maintains the configuration of the shift register without switching to the configuration of the binary counter. That is, the clock monitoring circuit 132 does not count the number of oscillations of the clock signal CLK1 in the count mode. As a result, since the measured value F2 is out of the expected range in the subsequent comparison mode, the clock monitoring circuit 132 outputs the H-level monitoring result M2. At this time, the abnormality detection circuit 235 outputs the H-level detecting signal D1 indicating that the clock monitoring circuit 132 has a failure.

Thereafter, when the count value of the down counter DC1 is set to the maximum value "1Fh" (i.e., when the value of the most significant bit of the count value is set to "1"), the sampling signal S1 is switched from the L-level to the H-level (time t 22). As a result, the clock monitoring circuit 131 starts counting the number of oscillations of the clock signal CLK1 at time t22.

At this time, in the clock monitoring circuit 131, since the sampling signal S1 indicates the H-level and the self-diagnosis successful signal K1 indicates the H-level, a binary counter is configured by the logic circuit LC1.

Thereafter, when the count value of the down counter DC 1 is counted down to become "0Fh" (i.e., when the value of the most significant bit of the count value changes from "1" to "0"), the sampling signal S1 is switched from the H-level to the L-level (time t23). Thereby, the measurement of the clock signal CLK1 by the binary counter configured by the logic circuit LC1 is finished, and the measured value of the clock signal is stored in the measured value storage register RG12.

Thereafter, when the count value of the down counter DC1 is counted down to "08h", the comparator signal C1 temporarily becomes H-level (time t23a).

Thus, the comparison circuit CP1 provided in the clock monitoring circuit 131 compares the measured value F1 stored in the measured value storage register RG12 with the expected value stored in the expected value storage register RG11, for example, in synchronization with the rising edge of the comparison signal C1 (time t23a). In FIG. 10, the comparison circuit CP1 outputs an L-level monitoring result M1 indicating that the measured value F 1 is within the expected range.

Thereafter, in synchronization with the falling edge of the comparator C1, the count value of the binary counter formed by the Logic circuit LC1 is initializing to "0" (time t23b).

When the measured value F 1 is out of the expected range in the clock monitoring circuit 131, the comparison circuit CP1 outputs the monitoring result M1 of the H-level in synchronization with the rise of the comparing signal C1, for example. At this time, the abnormality detection circuit 235 outputs the H-level detecting signal D1 indicating that the clock signal CLK1 is abnormal.

During the period in which the clock monitoring circuit 131 compares the measured value F1 with the expected value, the clock monitoring circuit 132 counts the number of oscillations of the clock signal CLK1 from time t23 to time t24.

Thereafter, when the count value of the down counter DC1 reaches "00h", the count value is Initializing to "2Fh" (time t 24). Thereafter, the operations from time t22 to t24 are repeated.

The comparison circuit CMP 1 provided in the abnormality detection circuit 235 compares the measured value F1 output from the clock monitoring circuit 131 with the measured value F2 output from the Clock monitoring circuit 132 in synchronization with the rising edges of the comparison signal C1 and the comparison signal C2. For example, when the measured value F1 and the measured value F2 coincide with each other, the L-level comparison result is outputted. In the example of FIG. 10, since the monitoring results M1 and M2 show L-levels and the comparison results of the comparison circuit CMP1 show L-levels, the Abnormality detection circuit 235 outputs an L-level detection signal D1 indicating that there is no error in the clock signal CLK1 and no failure in the Clock monitoring circuit 131 and 132.

When the measured value F1 and the measured value F3 do not coincide with each other in the abnormality detection circuit 235, the comparison circuit CMP1 outputs the H-level comparison result in synchronization with the rise of the comparison signal C1. At this time, the abnormality detection circuit 235 outputs the H-level detecting signal D1 indicating that the clock signal CLK1 is abnormal.

As described above, in the semiconductor device 2 according to the present embodiment, the respective clock monitoring circuit 131 and 132 configure counters for counting the number of oscillations of the clock signal CLK1 generated by the first oscillator circuit 11 according to the operation modes, and configure a shift register for detecting whether or not the pulses of the input signal are shifted to the output signal. That is, in the semiconductor device 2 according to the present embodiment, the clock monitoring circuit 131, 132 performs Self-diagnosis not only by monitoring the clock signal CLK1 but also by utilizing a period in which the clock signal CLK1 is not monitored. As a result, the semiconductor device 2 according to the present embodiment can perform the Self-diagnosis of the clock monitoring circuit 131, 132 with a smaller circuit size than the circuit size of the semiconductor device 1.

Further, in the present embodiment, in a predetermined period after the initializing by the reset signal RST, the operation mode of each of the clock monitoring circuit 131 and 132 is set to the self-diagnosis mode, and thereafter, the operation mode of each of the clock monitoring circuit 131 and 132 is periodically switched so that the operation mode of each of the count mode and the compare mode differs from each other among the count mode and the compare mode. As a result, the clock monitoring circuit 131 or 132 can monitor the CLK1 of the clock signal at all times by using one of the clock signals after the self-diagnosis is executed.

Furthermore, the semiconductor device 2 according to the present embodiment can monitor the CLK1 of clock signals by comparing the monitoring results of the clock monitoring circuit 131 and 132 with each other. However, comparing the monitoring results by the clock monitoring circuit 131 and 132 may be omitted. The abnormality detection circuit 235 is then configured to output the detected signals based only on the monitoring results M1, M2 by the clock monitoring circuit 131, 132.

Figure 11:
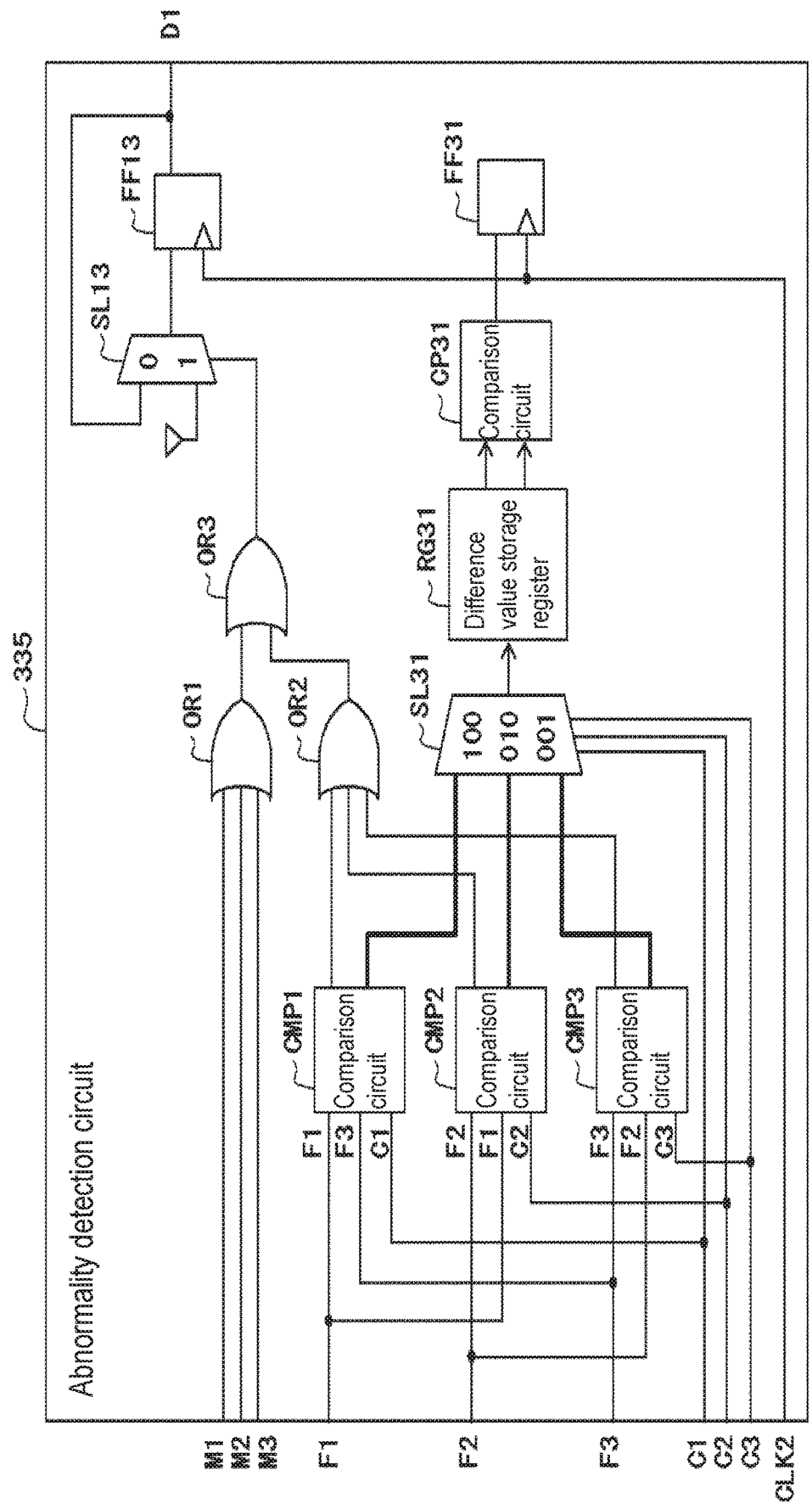
FIG. 11 is a diagram illustrating an exemplary configuration of an abnormality detection circuit provided in a semiconductor device according to a third embodiment.

FIG. 11 is a diagram showing a specific configuration of the abnormality detection circuit 335 provided in the semiconductor device 3 according to the third embodiment. The abnormality detection circuit 335 further includes selectors SL31, a difference storage register RG31, a comparison circuit CP31, and a flip-flop FF31 as compared with the abnormality detection circuit 135.

In response to the comparison signals C1 to C3, the selector SL31 selects and outputs one of the difference value between the measured value F1 and the measured value F3 compared by the comparison circuit CMP1, the difference value between the measured value F1 and the measured value F2 compared by the comparison circuit CMP2, and the difference value between the measured value F2 and the measured value F3 compared by the comparison circuit CMP3. For example, the selector SL31 selects and outputs the difference value output from the comparison result CMP1 when the comparison signal C1 is at the H-level, selects and outputs the difference value output from the comparison result CMP2 when the comparison signal C2 is at the H-level, and selects and outputs the difference value output from the comparison result CMP3 when the comparison signal C3 is at the H-level.

Difference values outputted from the selectors SL31 are sequentially stored in the difference value storage register RG31.

The comparison circuit CP31 compares the latest difference value stored in the difference value storage register RG31 with the difference value stored immediately before the latest difference value. Here, when the difference between the latest difference value and the immediately preceding difference value is larger than a predetermined value, the comparison circuit CP31 outputs a comparative result indicating that the oscillation frequency of the clock signal CLK1 generated by the first oscillator circuit 11 may fall outside the allowable range. The flip-flop FF31 fetches the result of the comparison by the comparison circuit CP31 in synchronization with the rising edge of the clock signal CLK2, and outputs the fetched result as a warning signal. The warning signal is used, for example, as an interrupt signal indicating a precursor to a failure of the first oscillator circuit 11.

Since the rest of the configuration of the semiconductor device 3 is the same as that of the semiconductor device 1, its explanation is omitted.

As described above, the semiconductor device 3 according to the present embodiment can exhibit the same effects as those of the semiconductor device 1, and can detect the presence of a sign of a failure in the first oscillator circuit 11 by monitoring the change in the measured value of the number of oscillations of the clock signal CLK1.

As described above, in the semiconductor device according to embodiments 1 to 3, the respective clock monitoring circuit configure counters for counting the number of oscillations of the clock signal generated by the oscillation circuits according to the operation modes, and configure a shift register for detecting whether or not the pulses of the input signal are shifted to the output signal. That is, in the semiconductor device according to embodiments 1 to 3, the clock monitoring circuit performs self-diagnosis not only by monitoring the clock signal but also by using periods during which the clock signal is not monitored. As a result, the semiconductor device according to the first to third embodiments does not require an additional verifying clock monitoring circuit, unlike the related art, and therefore, the self-diagnosis of the clock monitoring circuit can be performed without increasing the size of the circuits.

Although the invention made by the inventor has been specifically described based on the embodiment, the present invention is not limited to the embodiment already described, and it is needless to say that various modifications can be made without departing from the gist thereof.

What is claimed is:

1. A semiconductor device comprising:
a first oscillator circuit generates an internal clock signal;
a plurality of clock monitoring circuits; and
a mode switching circuit that periodically switches operation modes of the plurality of the clock monitoring circuits to any of a first mode, a second mode, and a third mode,
wherein a first clock monitoring circuit of the plurality of the clock monitoring circuits comprises:
a first clock counter;
a first comparison circuit; and
a first detection circuit,
wherein the first clock monitoring circuit executes a count processing which counts a number of oscillations by using the first clock counter at the first mode, executes a comparison processing which determines whether the number of oscillations is in a predetermined range by using the first comparison circuit at the second mode, and executes a detection processing which detects whether a pulse from an output signal to an input signal is shifted or not by using the first detection circuit at the third mode.

2. The semiconductor device according to claim 1, wherein the first clock counter comprises:
a plurality of cascaded flip-flops; and
a plurality of selectors that switches a signal inputted to each of the plurality of flip-flops according to an operation mode of the first clock monitoring circuit, and
wherein the first clock counter configures a binary counter by using the plurality of flip-flops in the first mode and configures a shift register by using the plurality of flip-flops in the third mode.

3. The semiconductor device according to claim 1, wherein the plurality of clock monitoring circuits further comprises:
a second clock monitoring circuit,
wherein the mode switching circuit is configured to switch periodically an operation mode of the second clock monitoring circuit to any of the mode from the first mode to the third mode, and
wherein the second clock monitoring circuit includes:
a second clock counter that is configured to count the oscillations at the first mode, and to shift the pulse of the input signal to the output signal in a normal state at the third mode;
a second comparison circuit that determines whether a count value during a predetermined period by the second clock counter is within a first expected value; and
a second detector that detects whether the pulses of the input signal are shifted to the output signal of the second clock counter at the third mode.

4. The semiconductor device according to claim 3, wherein each of the first clock counter and the second clock counter comprises:
a plurality of cascaded flip-flops; and
a plurality of selectors that switches a signal input to each of the plurality of flip-flops according to the operation mode is provided, and
wherein the first clock counter configures a binary counter by using the plurality of flip-flops at the first mode, and configures a shift register by using the plurality of flip-flops at the third mode.

5. The semiconductor device according to claim 3, wherein the mode switching circuit is configured to switch the operation modes of the first and second clock monitoring circuits such that in a first period, the operation modes of the first and second clock monitoring circuits are switched to the third mode, and in a second period after the first period, the operation modes of the first and second clock monitoring circuits are periodically switched to mutually distinct ones of the first and second modes.

6. The semiconductor device according to claim 5, wherein in the third mode, the pulses of the input signals of the first and second clock counters are generated by using a resetting signal to initialize a peripheral circuit which operates in synchronism with the internal clock signal.

7. The semiconductor device according to claim 3, wherein the plurality of clock monitoring circuits further comprises:
a third clock monitoring circuit,
wherein the mode switching circuit that is configured to switch periodically an operation mode of the third clock monitoring circuit to any of the mode from the first mode to the third mode, and
wherein the third clock monitoring circuit includes:
a third clock counter configured to count the oscillations of the internal clock signal at the first mode, and to shift the pulse of the input signal to the output signal in a normal state at the third mode;
a third comparison circuit that determines whether a count value during a predetermined period by the third counter is within a second expected value; and
a third detector that detects whether the pulses of the input signal are shifted to the output signal of the third clock counter at the third mode.

8. The semiconductor device according to claim 7, wherein each of the first to third clock counters comprises:
a plurality of cascaded flip-flops; and
a plurality of selectors that switches a signal input to each of the plurality of flip-flops according to an operation mode is provided, and
wherein the first clock counter configures a binary counter by using the plurality of flip-flops in the first mode and configures a shift register by using the plurality of flip-flops in the third mode.

9. The semiconductor device according to claim 7, wherein the mode switching circuit is a mode switching circuit for operating each of the first to third clock monitoring circuits, and for operating each of the first to third modes.

10. The semiconductor device according to claim 7, further comprising:
a count value comparison circuit,
wherein during the period in which the number of oscillations of the internal clock signal is counted by the first clock counter, the count value comparison circuit compares the count value per predetermined period by the second clock counter with the count value per predetermined period by the third clock counter,
wherein during the period in which the number of oscillations of the internal clock signal is counted by the second clock counter, the count value comparison circuit compares the count value per predetermined period by the third clock counter with the count value per predetermined period by the first clock counter, and wherein during the period in which the number of oscillations of the internal clock signal is counted by the third clock counter, the count value comparison circuit compares the count value per predetermined period by the first clock counter with the count value per predetermined period by the second clock counter.

11. The semiconductor device according to claim 7, wherein a warning signal is output when any of a difference between a first difference value which is a difference between count values per predetermined period by each of the second and third clock counters, a second difference value which is a difference between count values per predetermined period by each of the third and first clock counters, and a third difference value which is a difference between count values per predetermined period by each of the first and second clock counters, and a difference value output immediately before any of the first to third difference values is larger than a predetermined value.

12. A method for controlling a semiconductor device, wherein the semiconductor device includes:
    a first oscillator circuit generates an internal clock signal;
    a plurality of clock monitoring circuits; and
    a mode switching circuit that periodically switches an operation mode of the plurality of the clock monitoring circuits respectively to any of a first mode, a second mode, and a third mode, and
wherein the method comprising:
    a count step that counts a number of oscillations of the internal clock using a clock counter at the first mode;
    a comparison step that determines whether or not the number of oscillations of the internal clock signal is within an expected range by using a first comparison circuit at the second mode; and
    a detection step that detects whether pulses of an input signal are shifted to an output signal, by using a detection circuit at the third mode.

13. A semiconductor device comprising:
    a first oscillator circuit generates an internal clock signal;
    a first clock monitoring circuit;
    a second clock monitoring circuit; and
    a mode switching circuit that periodically switches an operation mode of the first clock monitoring circuit and the second clock monitoring circuit to any of a first mode, a second mode, and a third mode,
wherein the first clock monitoring circuit and the second clock monitoring circuit each comprises:
    a clock counter;
    a comparison circuit; and
    a detection circuit,
wherein each of the first clock monitoring circuit and the second clock monitoring circuit executes:
    a count processing that counts, using the first clock counter at the first mode, a number of oscillations;
    a comparison processing that determines, using the first comparison circuit at the second mode, whether the number of oscillations is in a predetermined range; and
    a detection processing that detects, using the first detection circuit at the third mode, whether a pulse from an output signal to an input signal is shifted or not, and
wherein the mode switching circuit switches the operation modes of the first and second clock monitoring circuits such that in a first period, the operation modes of the first and second clock monitoring circuits are switched to the third mode, and in a second period after the first period, the operation modes of the first and second clock monitoring circuits are periodically switched to mutually distinct one of the first and second modes.

14. The semiconductor device according to claim 13, wherein in the third mode, the pulse of the input signal of the clock counter in each of the first clock monitoring circuit and the second clock monitoring circuit is generated by using a resetting signal to initialize a peripheral circuit which operates in synchronism with the internal clock signal.

* * * * *